(12) United States Patent
Fitzgerald et al.

(10) Patent No.: US 7,256,058 B2
(45) Date of Patent: Aug. 14, 2007

(54) DEVICE AND METHOD FOR PACKAGE WARP COMPENSATION IN AN INTEGRATED HEAT SPREADER

(75) Inventors: Thomas J. Fitzgerald, Phoenix, AZ (US); Carl L. Deppisch, Phoenix, AZ (US); Fay Hua, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/470,209

(22) Filed: Sep. 5, 2006

(65) Prior Publication Data

US 2007/0020813 A1    Jan. 25, 2007

Related U.S. Application Data

(60) Continuation of application No. 11/047,811, filed on Feb. 1, 2005, now Pat. No. 7,102,226, which is a division of application No. 10/023,720, filed on Dec. 21, 2001, now Pat. No. 6,848,172.

(51) Int. Cl.
*G01R 31/26* (2006.01)
*H01L 21/66* (2006.01)
*G06F 17/50* (2006.01)

(52) U.S. Cl. ............................. 438/15; 716/2; 716/18; 257/E21.53

(58) Field of Classification Search ............... 438/15
See application file for complete search history.

(56) References Cited

U.S. PATENT DOCUMENTS 6,133,071 A    10/2000   Nagai
6,139,975 A    10/2000   Mawatari et al.
6,203,191 B1 *  3/2001   Mongan ................... 374/43
6,466,446 B1 * 10/2002   Nagy et al. .............. 361/708
6,848,172 B2    2/2005   Fitzgerald et al.
7,102,226 B2    9/2006   Fitzgerald et al.
2005/0139998 A1 6/2005   Fitzgerald et al.

FOREIGN PATENT DOCUMENTS

JP     60-046037     3/1985
JP     02-077143     3/1990

OTHER PUBLICATIONS

Kelly, G. , et al., "Accurate Prediction of PQFP Warpage", *IEEE Proceedings of the Electronic Components and Technology Conference*, 44, Washington,(1994),102-106.

(Continued)

*Primary Examiner*—David A. Zarneke
(74) *Attorney, Agent, or Firm*—Schwegman, Lundberg, Woessner & Kluth, P.A.

(57) ABSTRACT

A device and method for designing and manufacturing an integrated heat spreader so that the integrated heat spreader will have a flat surface on which to mount a heat sink after being assembled into a package and exposed to the heat of a die. This device and method for designing and manufacturing an integrated heat spreader would generate a heat spreader that would be built compensate for deformations resulting from (1) physical manipulation during assembly (2) thermal gradients during operation and (3) differing rates of expansion and contraction of the package materials coupled with multiple package assembly steps at elevated temperatures so that one surface of the integrated heat spreader would have a flat shape.

30 Claims, 9 Drawing Sheets

OTHER PUBLICATIONS

Metrol, A., "Stress Analysis and Thermal Characterization of a High Pin Count PQFP", *Transactions of the ASME: Journal of Electronic Packaging*, 114, (1992),211-220.

Zhang, X., et al., "Thermo-Mechanical Analysis for a Multi Chip Build Up Substrate Based Package", *Proceedings of the 2001 8th International Symposium on the Physical and Failure Analysis of Integrated Circuits, IPFA 2001 (Cat. No. 01TH8548)*, (2002),67-72.

* cited by examiner

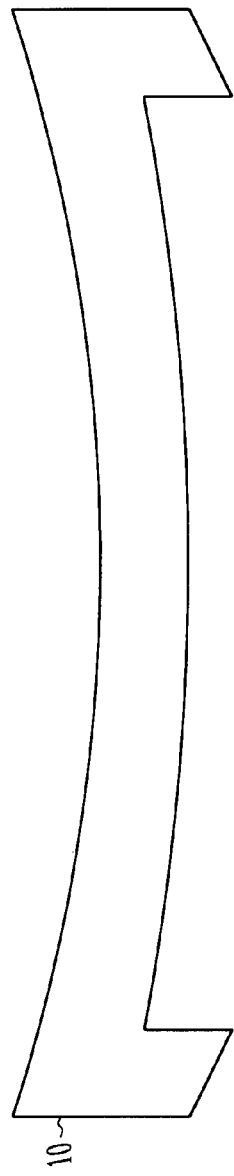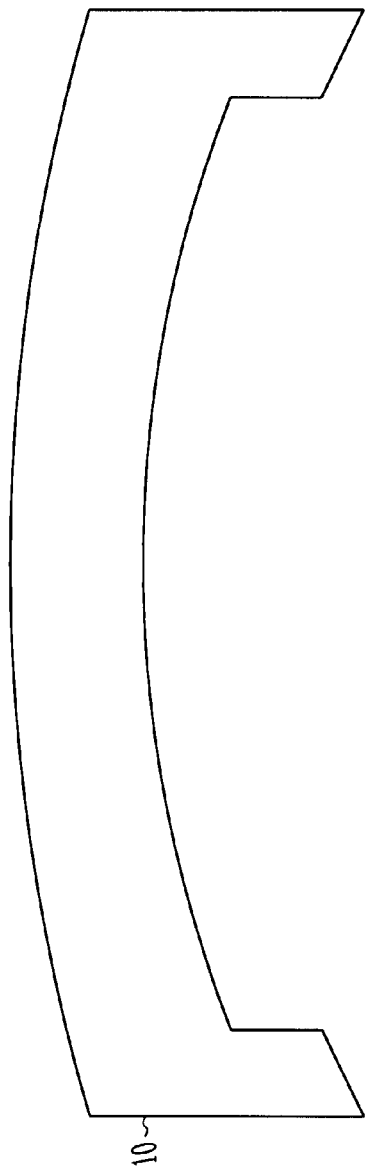
Fig. 5A
Fig. 5B

DEVICE AND METHOD FOR PACKAGE WARP COMPENSATION IN AN INTEGRATED HEAT SPREADER

RELATED APPLICATION(S)

This application is a Continuation of U.S. application Ser. No. 11/047,811 filed on Feb. 1, 2005 now U.S. Pat. No. 7,102,226 which is a Divisional Application of U.S. application Ser. No. 10/023,720 filed Dec. 21, 2001 now issued as U.S. Pat. No. 6,848,172. These applications are incorporated herein by reference.

FIELD

The invention relates to a device and method for package warp compensation in an integrated heat spreader. More particularly, the present invention is a device and method that determines the warpage in an integrated heat spreader (IHS) and compensates for this warpage to improve the heat dissipating properties of the IHS.

BACKGROUND

In the rapid development of computers many advancements have been seen in the areas of processor speed, throughput, communications, fault tolerance and size of individual components. Today's microprocessors, memory and other chips have become faster and smaller. However, with the increase in speed, reduction in the size of components, and increased density of circuitry found within a given chip/die, heat generation and dissipation have become a more critical factor than ever.

To facilitate the dissipation of the heat generated by a die, an IHS may be affixed to the die and maybe used in conjunction with a heat sink. The IHS is affixed to the die with a layer of thermal interface material that is used to provide some adhesion between the IHS and the die and transfer heat from the die to the IHS. In addition, a heat sink may be placed on top of the IHS with a layer of a thermal interface material placed between the IHS and heat sink to facilitate a limited amount of adhesion and transfer heat from the IHS to the heat sink. The heat sink may have vertical fans extending therefrom to increase the surface area of the heat sink and facilitate the transfer of heat from the IHS to the ambient air. As would be appreciated by one of ordinary skill in the art these heat sinks may take many different forms and may include a small electric fan.

A package may be formed during the assembly process by affixing the die to a substrate and then placing the IHS on top of the die and the heat sink on top of the IHS. The placement of the IHS on top of the die may be accomplished utilizing an industrial robot arm with a grasping tool affixed to the robot arm. The grasping tool may hold the IHS at the edges thereof and place it on top of the die.

Since the die may be made flat and rectangular or square in shape, the IHS is also designed to be flat so that the thermal interface material between the die and the IHS and the thermal interface material between the IHS and heat sink is of a uniform thickness to dissipate heat throughout the die to the IHS and thereafter to the heat sink.

However, because the assembled package contains materials with different coefficients of thermal expansion, and because the package is assembled in steps at various temperatures and because temperature gradients exist in a "powered-up" package the IHS will deform so that it no longer remains flat. Once this deformation occurs in the IHS, the thickness of the thermal interface material between the heat sink and the IHS would vary and the IHS would no longer be able to uniformly dissipate heat from the die to the heat sink.

Further, even though a die may be relatively small, the heat generated by a die may not be evenly distributed throughout the die. In other words, hotspots may be seen in relatively small locations of a die where power consumption is high or heat generating circuits are present.

Therefore, what is needed is a device and method that can determine the manner in which an IHS will deform due to either or both physical manipulation of the IHS itself and heat fluctuations caused by powering on and off the die in the package. Further, this device and method should compensate for the warpage seen in the IHS so that the distance between the IHS and heat sink remain approximately constant. Still further, this device and method should compensate for hotspots on a die and provide additional heat dissipating material in an IHS.

BRIEF DESCRIPTION OF THE DRAWINGS

The foregoing and a better understanding of the present invention will become apparent from the following detailed description of exemplary embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein:

FIG. 5A is an example of an IHS 10 having a shape designed to compensate for the curvature seen in FIGS. 2, 4A, 4B and 4C in an example embodiment of the present invention;

FIG. 5B is an example of an IHS 10 having a shape designed to compensate for the curvature seen in FIG. 3 in an example embodiment of the present invention;

DETAILED DESCRIPTION

Figure 1:
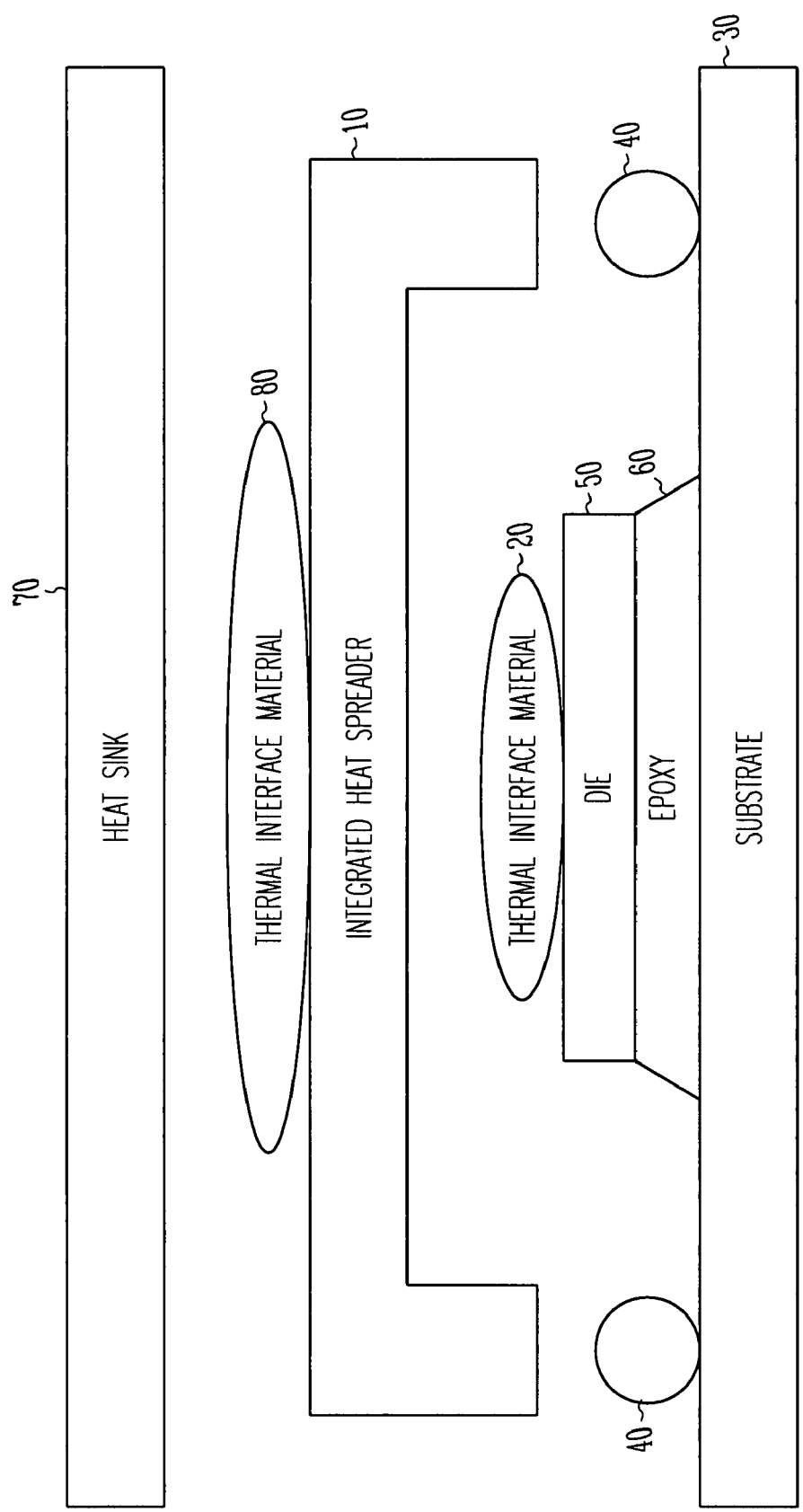
FIG. 1 is an example of a package prior to assembly in an example embodiment of the present invention.

Before beginning a detailed description of the subject invention, mention of the following is in order. When appropriate, like reference numerals and characters may be used to designate identical, corresponding or similar components in differing figure drawings. Further, in the detailed description to follow, exemplary sizes/models/values/ranges may be given, although the present invention is not limited to the same. As a final note, well-known components of computer networks may not be shown within the FIGS. for simplicity of illustration and discussion, and so as not to obscure the invention.

FIG. 1 is an example of a package prior to assembly in an example embodiment of the present invention. FIG. 1 illustrates a package having a die 50 attached to a substrate 30 using epoxy 60 with a finite amount of a thermal interface material (TIM) 20 placed on top of the die 50. This TIM 20 serves at least two primary purposes. First, it acts to conduct heat from the die to the integrated heat spreader (IHS) 10. Second, it also provides some adhesion between the IHS 10 and die 50. During the manufacturing process the IHS 10 is pressed down upon the TIM 20 and adhesive 40. Thereafter, thermal interface material (TIM) 80 would be placed on IHS 10 with the heat sink 70 placed on top of IHS 10. TIM 80 serves the same function as TIM 20 and may be composed of the same material. Throughout the foregoing discussion the term package will refer to the combination of, but not limited to, the substrate 30, epoxy 60, die 50, thermal interface material 20, IHS 10, thermal interface material 80, heat sink 70 and adhesive 40.

Figure 2:
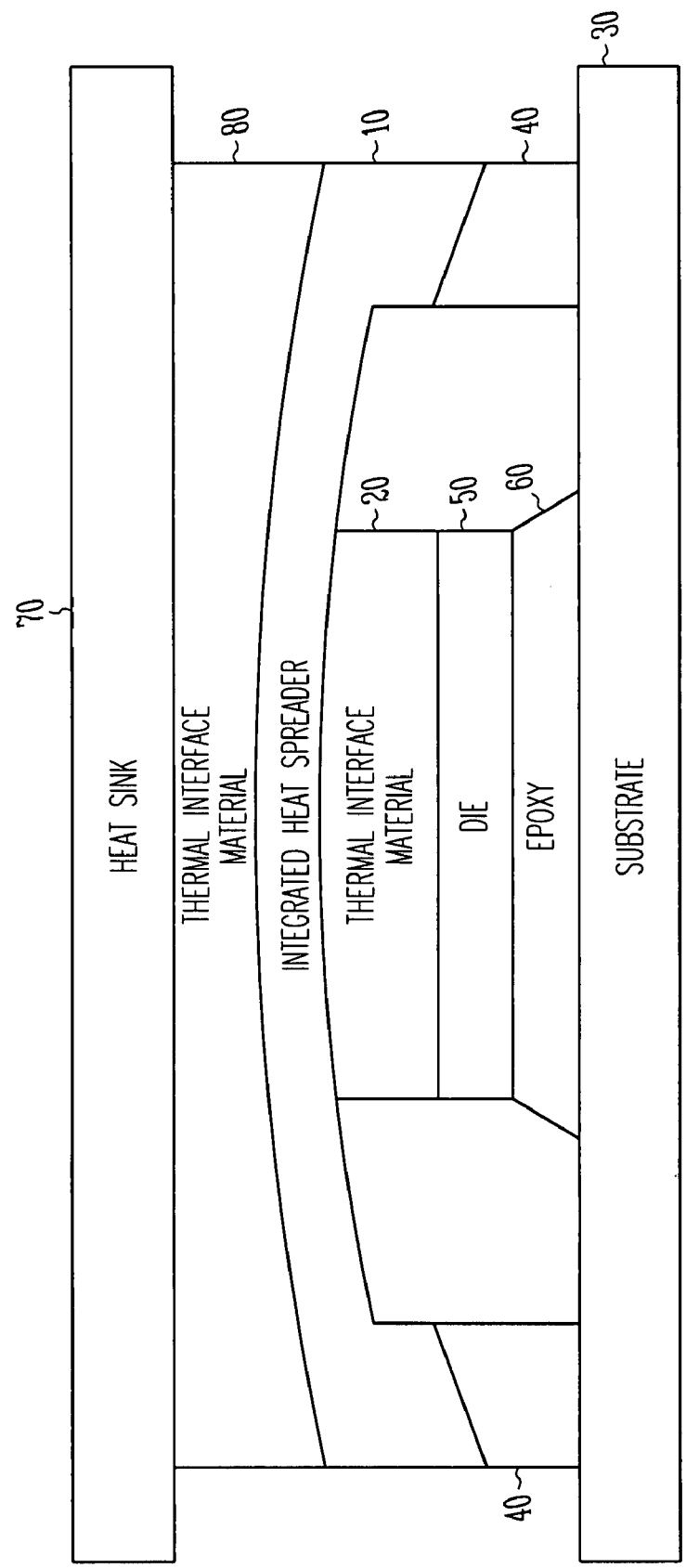
FIG. 2 is an example of an assembled package with the IHS 10 having deformed by bowing out in the center due to differences in package material coefficients of thermal expansion or to physical manipulation and/or temperature gradients in an example embodiment of the present invention.

FIG. 2 is an example of an assembled package with the IHS 10 deformed by bowing out in the center due to physical manipulation and/or temperature fluctuations in an example embodiment of the present invention. As shown in FIG. 2, the IHS 10 would absorb heat from die 50 through TIM 20 and be held in place on the substrate 30 via adhesive 40. On top of the IHS 10 a heat sink 70 or fan/heat sink combination (not shown) would be mounted to dissipate the heat absorbed by the IHS 10. However, since IHS 10 and TIM 20 both experience significant stresses during the assembly process and due to (1) physical manipulation and applied stresses during package assembly and (2) thermal expansion and contraction when the die is powered on and off, and (3) differences in material coefficients of thermal expansion, the IHS 10 may change its shape. As indicated in FIG. 2, the IHS 10 has bowed outward in the center so that TIM 80 is thicker in the center between heat sink 70 and IHS 10 as opposed to the outer edges. As previously discussed die 50 is connected to substrate 30 via epoxy 60. IHS 10 is affixed to substrate 30 via adhesive 40. Further, die 50 is connected to IHS 10 via TIM 20.

Figure 3:
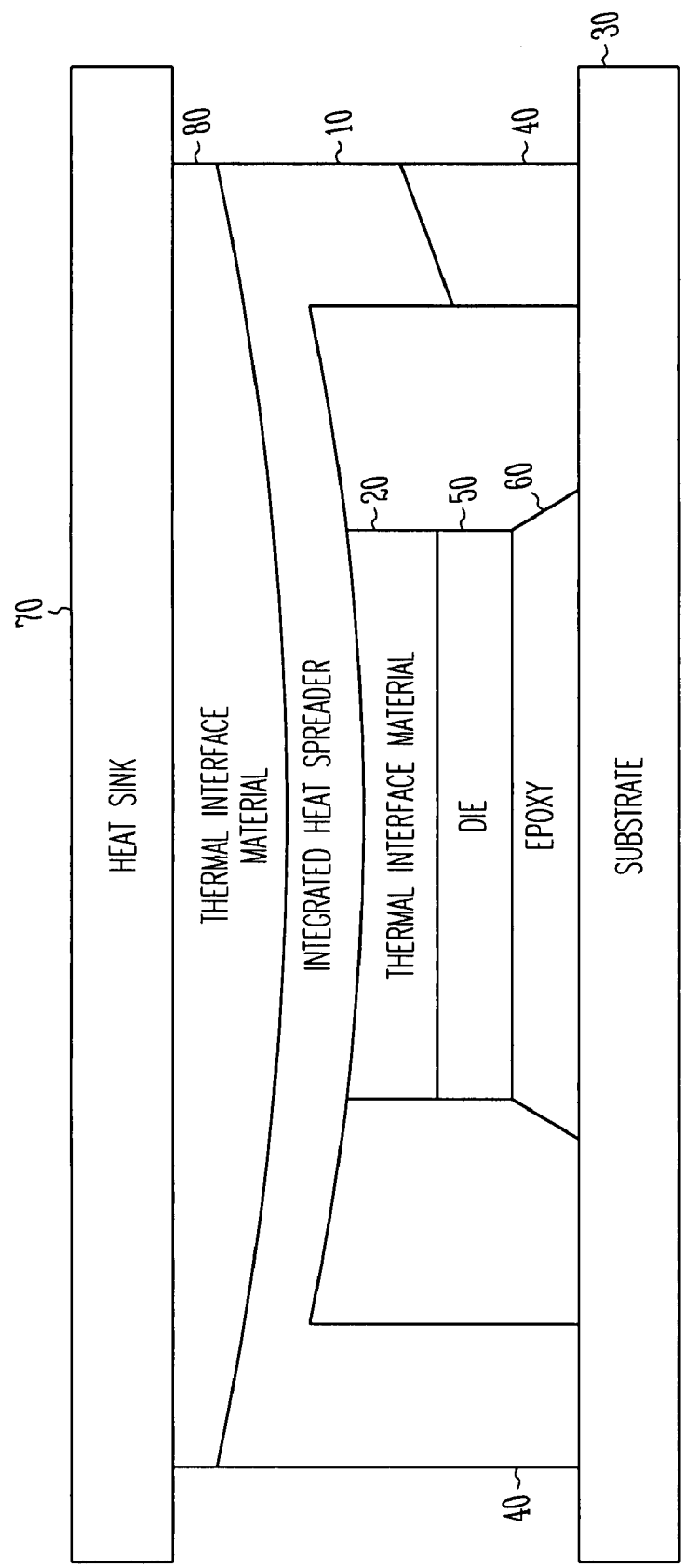
FIG. 3 is an example of an assembled package with the IHS 10 having deformed by bowing in in the center due to differences in package materials coefficients of thermal expansion or to physical manipulation and/or temperature gradients in an example embodiment of the present invention.

FIG. 3 is an example of an assembled package with the IHS 10 having deformed by bowing in the center due to physical manipulation and/or temperature fluctuations or differences in material coefficients of thermal expansion in an example embodiment of the present invention. The sole difference between FIG. 2 and FIG. 3 is the nature of the deformation of the IHS 10. As would be appreciated by one of ordinary skill in the art how the IHS 10 may be deformed is dependent on the materials it is made of, the manner of handling, and the heat it is exposed to by die 50. Therefore, FIGS. 2 and 3 are provided merely as examples of how an IHS 10 may deform. Regarding the heating of the IHS 10 this is dependent upon how die 50 generates and dissipates heat. For example, die 50 may generate heat at a specific location such as the center of the die 50 or it may dissipate heat at the outer edges of the die 50. The manner in which die 50 dissipates heat would directly affect the deformation seen in the IHS 10. Since all other elements shown in FIG. 3 remain the same as that shown in FIG. 2, no further discussion of these elements will be provided here.

Figure 4C:
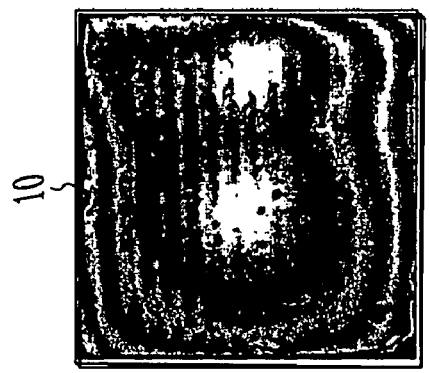
FIG. 4C is an example of a Moiré Fringe image of an IHS 10 assembled into a package, where the entire package is being soaked at 90 degrees Celsius in an example embodiment of the present invention.
Figure 4B:
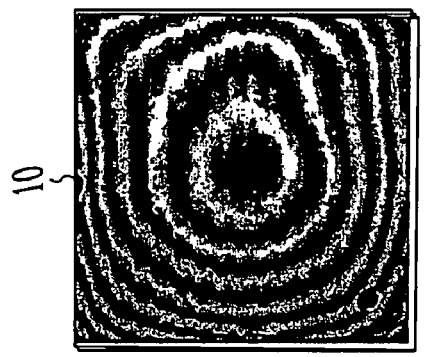
FIG. 4B is an example of a Moiré Fringe image of an IHS 10 at room temperature after being attached to the substrate in an example embodiment of the present invention.
Figure 4A:
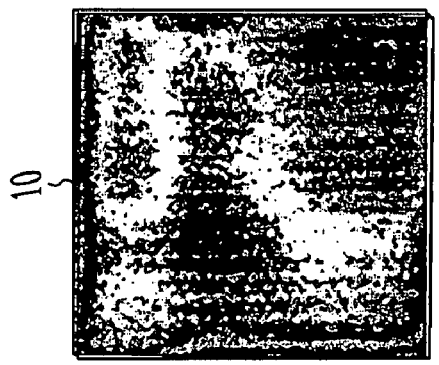
FIG. 4A is an example of a Moiré Fringe image of a free-standing IHS 10 as supplied by a manufacturer in an example embodiment of the present invention.

FIG. 4A is an example of a Moiré Fringe illustration of an IHS 10 as supplied by a manufacturer without being attached to a substrate 30 in an example embodiment of the present invention. It should be noted that the sensitivity of the Moiré Fringe illustration is 12.5 microns per fringe and that FIG. 4A is a top view of IHS 10. As indicated in FIG. 4A, as received from the manufacturer the IHS 10 is effectively flat.

FIG. 4B is an example of a Moiré Fringe illustration of an IHS 10 after being at room temperature as assembled into a package in an example embodiment of the present invention. As with FIG. 4A, it should be noted that the sensitivity of the Moiré Fringe illustration is 12.5 microns per fringe and that FIG. 4B is a top view of IHS 10. As indicated in FIG. 4B, after attachment to substrate 30 and at room temperature the IHS 10 significantly deformed as compared to that received from the manufacturer of the IHS 10. Since assembly occurs at room temperature, but curing of the sealant occurs at elevated temperatures, the entire package will warp when cooled to room temperature as seen in FIG. 4B. This can affect the adhesion between the heat sink 70 and the IHS 10 using the thermal interface material 80, as shown in FIG. 2. Further, it would affect the thickness of the thermal interface material 80 and thereby the heat dissipation capabilities of the heat sink 70. In FIG. 4B a substrate is attached to the IHS, however, it is not visible in the picture.

FIG. 4C is an example of a Moiré Fringe illustration of an IHS 10 in an assembled package, where the package is being exposed to a 90 degree Celsius heat soak after attachment to substrate 30 (not shown) in an example embodiment of the present invention. As previously mentioned regarding FIGS. 4A and 4B, it should be noted that the sensitivity of the Moiré Fringe illustration is 12.5 microns per fringe and that FIG. 4c is a top view of IHS 10. As indicated in FIG. 4C, as the temperature of the entire package is increased to 90 degree Celsius, the IHS 10 actually flattens slightly as compared to that shown in FIG. 4B that is at room temperature. However, there is still significant deformation involved in the IHS 10 shown in FIG. 4C to the point where two small bumps are formed in the IHS 10.

FIGS. 4A through 4C are provided merely as examples of the type of deformation that may be seen in an IHS 10. As would be appreciated by one of ordinary skill in the art, the type of deformation that would be seen in the IHS 10 would depend upon the type of manipulation received during assembly, the materials the IHS 10 and the other package components are composed of, the temperature range the IHS 10 is exposed to, etc. Therefore, in designing the IHS 10 to compensate for any deformation seen it is necessary to provide a process and method that can handle any deformation possible. Further, as would be appreciated by one of ordinary skill in the art, a Moiré Fringe analysis is only one method of many for measuring deformation in the IHS 10. Other examples would include utilizing laser or even a touch probe to measure the deformation. All these methods of measuring the shape of the IHS 10 will collectively be referred to as a dimensional analysis from this point forward.

FIG. 5A is an example of an IHS 10 having a shape to compensate for the curvature seen in FIGS. 2, 4A, 4B and 4C in an example embodiment of the present invention. The convex shape of the IHS 10 illustrated in FIG. 5A is depressed in the middle of the IHS 10. This convex shape would be supplied by the manufacturer of the IHS 10 and would compensate for the deformation seen in FIG. 2 and FIGS. 4A through 4C. As would be appreciated by one of the ordinary skill in the art, the precise curvature of the IHS 10 would depend upon the nature of the deformation seen.

FIG. 5B is an example of an IHS 10 having a shape to compensate for the curvature seen in FIG. 3 in an example embodiment of the present invention. The IHS 10, shown in FIG. 5B, is provided by the manufacturer to compensate for the deformation seen in FIG. 3. In this case, the center of the IHS 10 is bowed outward. As would be appreciated by one of the ordinary skill in the art, the precise curvature of the IHS 10 would depend upon the nature of the deformation seen.

The IHS 10 illustrated in FIG. 5A and FIG. 5B are provided as merely examples of ways to compensate for deformations in an IHS 10. Depending upon the deformation involved any number of different compensating shapes may be provided. However, it should be noted that the compensation provided in the IHS 10 should be opposite to that seen when the IHS 10 is mounted and is operating at the die temperature. The goal should be for the compensated IHS 10 to be flat as will be discussed further in reference to FIG. 6.

Figure 6:
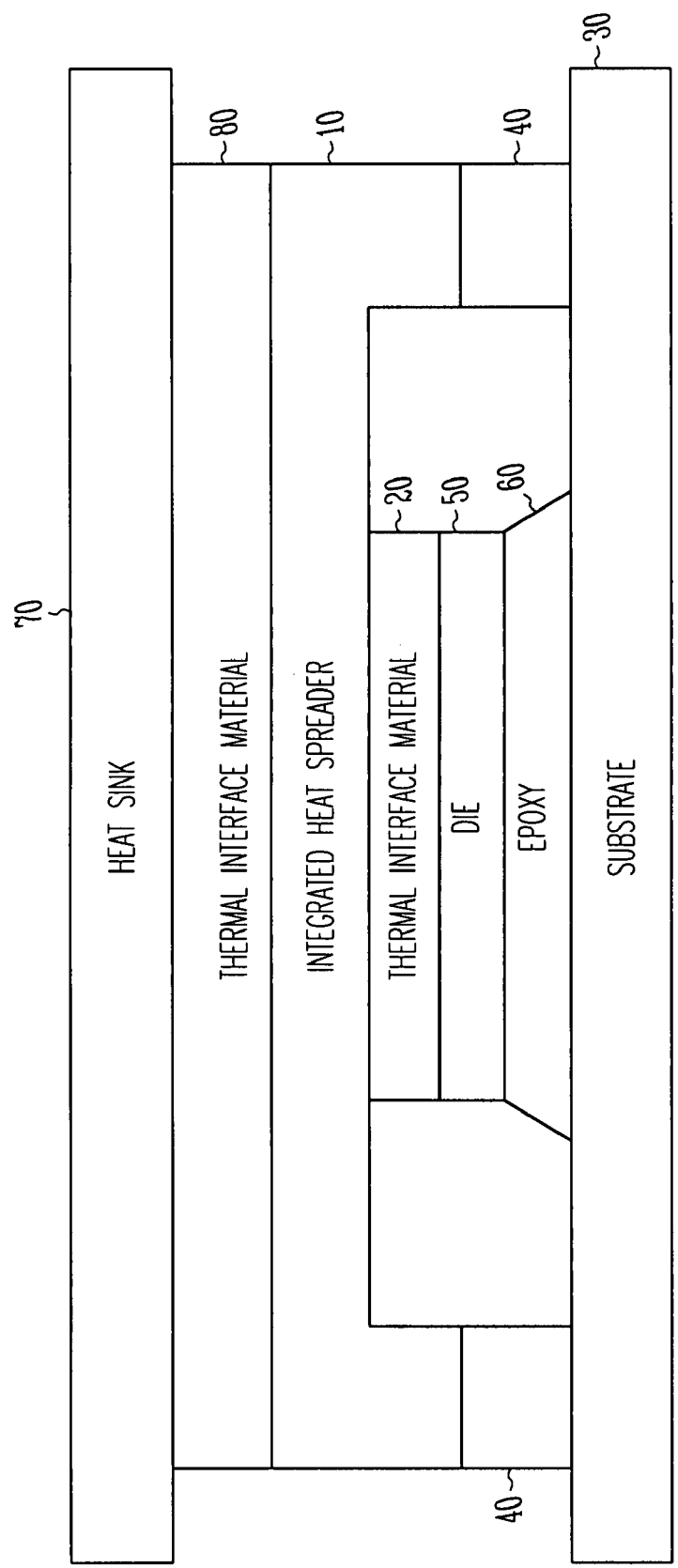
FIG. 6 is an example of an assembled package in which the IHS 10 has been processed utilizing the compensated IHS 10 shown in FIG. 5A or 5B and the logic shown in either FIG. 7 or FIG. 8 in an example embodiment of the present invention.
Figure 7:
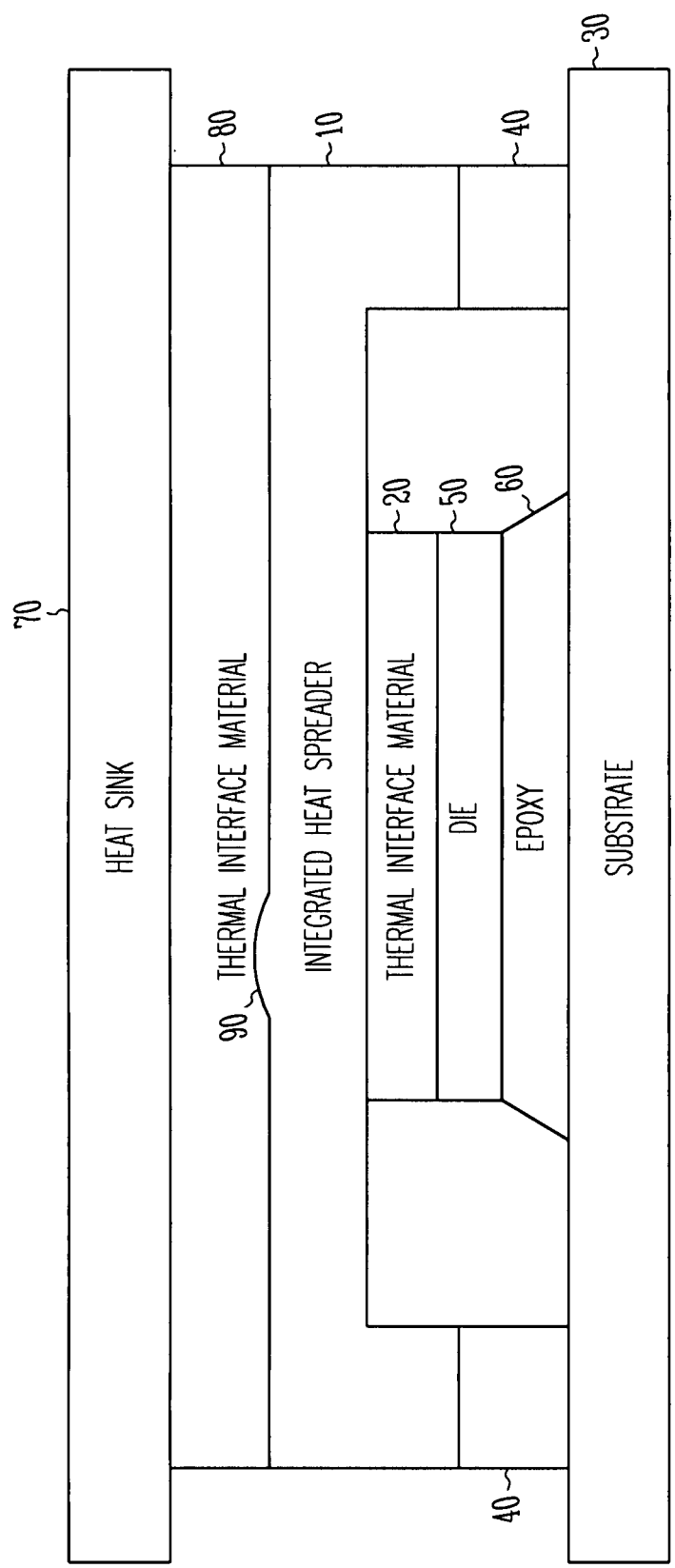
FIG. 7 is an example of an assembled package in which the IHS 10 has been processed utilizing the compensated IHS 10 shown in FIG. 5A or 5B and the logic shown in either FIG. 7 or FIG. 8 taking into consideration a hotspot on die 50 in an example embodiment of the present invention.
Figure 8:
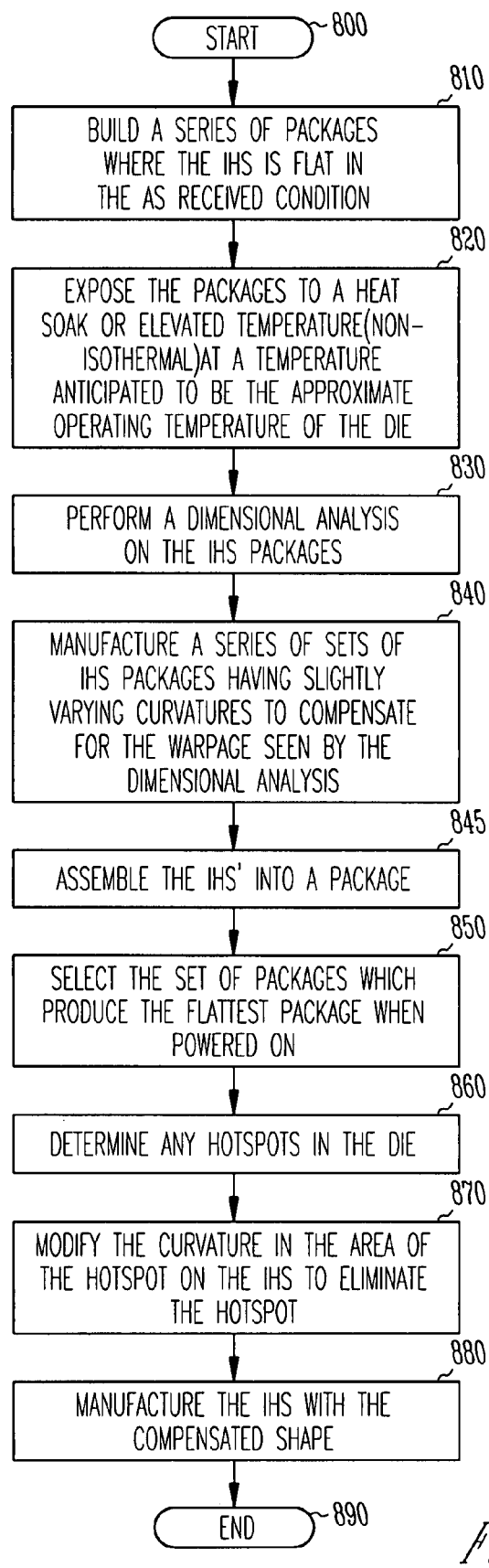
FIG. 8 is an example of the process used to generate the IHS 10 shown in FIGS. 5A and 5B resulting in the IHS 10 shown in FIGS. 6 and 7 in an example embodiment of the present invention.

FIG. 6 is an example of an assembled package in which the IHS 10 has been processed utilizing the compensated IHS 10 shown in FIG. 5A or 5B and the logic shown in either FIG. 7 or FIG. 8 in an example embodiment of the present invention. It should be noted that the package illustrated in FIG. 6 is identical to the packages shown in FIGS. 2 and 3 with the exception that the IHS 10 is flat and the thermal interface material 80 is of a constant thickness between the IHS 10 and the heat sink 70. Therefore, using the IHS 10 as shown in either FIG. 5A or FIG. 5B it is possible once the IHS 10 is grasped by the robot tool and mounted onto die 50 and substrate 30 for it to take on a flat shape once the die 50 has obtained its operating temperature. The remaining elements shown in FIG. 6 remain unchanged from those previously discussed in FIGS. 1 through 3 and will not be discussed further here.

FIG. 7 is an example of an assembled package in which the IHS 10 has been processed utilizing the compensated IHS 10 shown in FIG. 5A or 5B and the logic shown in either FIG. 7 or FIG. 8 taking into consideration a hotspot on die 50 in an example embodiment of the present invention. The package shown in FIG. 7 is identical to that shown in FIG. 6 with the exception that additional material 90 has been added to the IHS 10 in order to facilitate the transmission of the heat from a specific location on die 50 to heat sink 70. This specific location on die 50 is referred to as a hotspot since it generates more heat than other portions over the die 50. As would be appreciated by one of ordinary skill in the art, certain areas of the die 50 would generate more heat than others due to the nature of the circuitry at that location. By increasing the thickness of the IHS 10 at that hotspot, it would be possible to increase the heat transfer capacity of the IHS 10 at that location since the distance between the IHS 10 and heat sink 70 would be reduced. Of course, the reverse is also possible and the IHS 10 may be made thinner at selected points.

Figure 9:
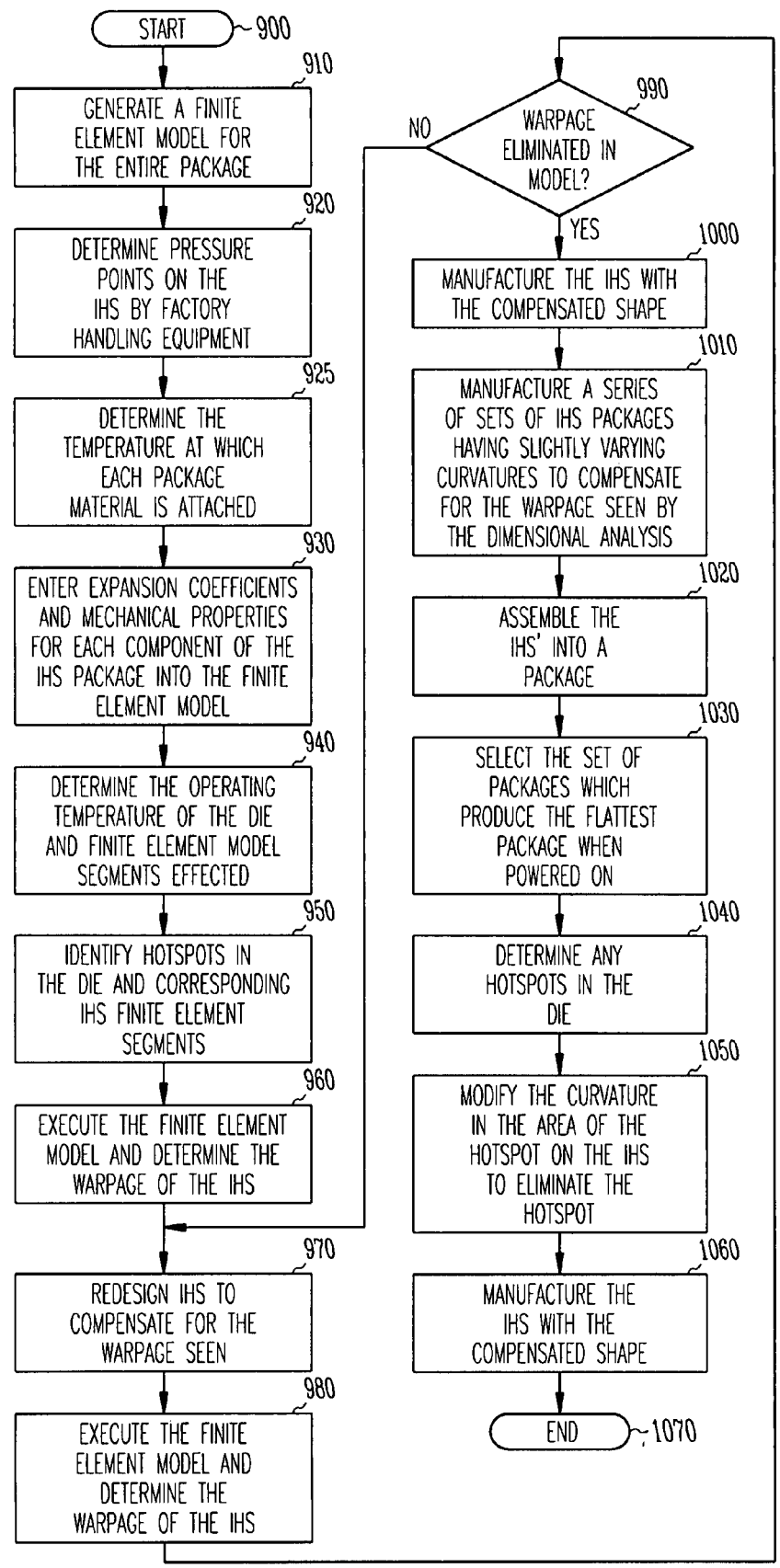
FIG. 9 is an example of the process used to generate the IHS 10 shown in FIGS. 5A and 5B resulting in the IHS 10 shown in FIGS. 6 and 7 in an example embodiment of the present invention.

Before proceeding into a detailed discussion of the logic used by the embodiments of the present invention it should be mentioned that the flowcharts shown in FIGS. 8 and 9 may contain software, firmware, hardware, processes or operations that correspond, for example, to code, sections of code, instructions, commands, objects, hardware or the like, of a computer program that is embodied, for example, on a storage medium such as floppy disk, CD Rom, EP Rom, RAM, hard disk, etc. Further, the computer program can be written in any language such as, but not limited to, for example C++.

FIG. 8 is an example of the process used to generate the IHS 10 shown in FIGS. 5A and 5B resulting in the IHS 10 shown in FIGS. 6 and 7 in an example embodiment of the present invention. Processing begins in operation 800 and immediately proceeds to operation 810. In operation 810 a series of packages are built which include IHS 10 elements that are flat in the as received condition from the supplier. Thereafter, in operation 820 the packages are heat soaked or elevated to an approximate temperature at which the die 50 is anticipated to operate at. In operation 830, a dimensional analysis is performed on the IHS 10 in each package. This die dimensional analysis may use a Moiré Fringe analysis or some other technique for measuring the deformation in the IHS 10 in each package. As part of the analysis performed in operation 830 a statistical analysis is performed on the results of the dimensional analysis received for each IHS 10. In this manner an average deformation for each IHS 10 can be determined. Thereafter, processing proceeds to operation 840 where a series of sets of IHS 10's is are generated that have a slightly varying curvature to compensate for the warpage seen by the die dimensional analysis performed in operation 830. Each set of IHS 10's would comprise a statistically significant number of IHS 10's that would be of consistent shape with one another within a set, but would vary in degree of compensation from one set to another. In this manner it would be possible to select the degree of compensation that best corrects the warpage seen. However, as would be appreciated by one of ordinary skill in the art, alternatively a simple series of IHS 10's may be manufactured and installed in packages. This simple series of IHS 10's may simply vary in the degree of compensation or curvature to form an equal distribution of IHS 10's of varying curvatures. In operation 845 the IHS 10's are assembled into packages which comprise all the elements shown in FIGS. 1 through 3.

Still referring to FIG. 8, processing then proceeds to operation 850 in which the set of packages or package that has the flattest package when powered on is selected as the template for the IHS 10 design. Thereafter, in operation 860 it is determined if die 50 has any hotspots therein. In the preferred embodiment operation 860 may be performed on the assembled package with the heat sink 70 attached. In this way the correct stress and thermal conditions seen in actual use are achieved. In a preferred embodiment the hotspots are determined by temperature sensors contained within the die 50 itself. In operation 870 for any hotspots found in die 50, the curvature of the IHS is modified in the area of the hotspot to eliminate it. Thereafter, processing proceeds to operation 880 where the IHS 10 with the compensated shape for warpage and hotspots is manufactured. Processing then proceeds to operation 890 where processing terminates.

FIG. 9 is an example of the process used to generate the IHS 10 shown in FIGS. 5A and 5B resulting in the IHS 10 shown in FIGS. 6 and 7 in an example embodiment of the present invention. Processing begins execution in operation 900 and immediately proceeds to operation 910. In operation 910, a finite element model is generated for the entire package including the IHS 10. Finite element models comprise dividing a structure into a fixed number of smaller pieces or elements and inputting each element and its respective coordinates and relationships to other elements into a computer system. In addition, the properties of each element, such as, but not limited to, temperature expansion coefficients, elasticity, heat transfer capability, modulus of elasticity tensile strength, etc. are entered into the finite element model. Processing then proceeds to operation 920 where the pressure points generated by the factory handling equipment, such as, but not limited to, a robot arm and grasping device, are entered into the finite element model. These pressure points would comprise the amount of pressure being placed on specific elements in the finite element model. The pressure experienced by these specific elements would be transferred to other elements contained within the model.

Still referring to FIG. 9, in operation 930 expansion coefficients and mechanical properties of each element of the package are also entered into the finite element model. In operation 940 the operating temperature of the die 50 is determined and which elements in the finite element model are affected by the temperature increase of the die 50. For example, the epoxy 60 would have a different expansion coefficient than the IHS 10, or the heat sink 70. Processing then proceeds to operation 950 where the hotspots, if any, in the die 50 are identified and the corresponding elements in the IHS 10 are also determined. In operation 960 a finite element model is executed and the warpage of the IHS 10 is determined from the finite element model. Thereafter, in operation 970 the IHS 10 is redesigned to compensate for the warpage seen in operation 960. In operation 980 the finite element model is executed again with the exception that the IHS 10 compensated for the warpage seen earlier is utilized in the model. This would entail replacing the elements of the IHS 10 that are changed with new elements of possibly different shape and existing in different positions. Thereafter, in operation 990 it is determined if any warpage can be seen utilizing the compensated IHS 10 in the finite element model. If the warpage is not eliminated in the finite element model then processing returns to operation 970 where it is repeated. However, if the warpage is eliminated in the finite element model in operation 980, then processing proceeds from operation 990 to operation 1000. In operation 1000 a series of sets of IHS 10's is are generated that have a slightly varying curvature to the IHS 10 determined by the finite element model. Each set of IHS 10's would comprise a statistically significant number of IHS 10's that would be of consistent shape with one another within a set, but would vary in degree of compensation from one set to another. In this manner it would be possible to select the degree of compensation that best corrects the warpage actually seen as opposed to that predicted by the finite element model. As would be appreciated by one of ordinary skill in the art, no matter how well the finite element model is generated it still may not behave precisely as predicted in actual operation. Still further, as would be appreciated by one of ordinary skill in the art, alternatively a simple series of IHS 10's may be manufactured and installed in packages. This simple series of IHS 10's may simply vary in the degree of compensation or curvature to form an equal distribution of IHS 10's of varying curvatures were the IHS 10 generated by the finite element model being the medium IHS 10. In operation 1010 the IHS 10's are assembled into packages that comprise all the elements shown in FIGS. 1 through 3.

Still referring to FIG. 9, processing then proceeds to operation 1030 in which the set of packages or package that has the flattest package when powered on is selected as the template for the IHS 10 design. Thereafter, in operation 1040 it is determined if die 50 has any hotspots therein. In the preferred embodiment operation 860 may be performed on the assembled package with the heat sink 70 attached. In this way the correct stress and thermal conditions seen in actual use are achieved. In a preferred embodiment the hotspots are determined by temperature sensors contained within the die 50 itself. In operation 1050 for any hotspots found in die 50, the curvature of the IHS is modified in the area of the hotspot to eliminate it. Thereafter, processing proceeds to operation 1060 where the IHS 10 with the compensated shape for warpage and hotspots is manufactured. Processing then proceeds to operation 1070 where processing terminates.

The benefits resulting from the present invention is that an IHS 10 may be designed that will create an approximately flat package even after manipulation and exposure to fluctuations in temperature. With such a near flat package it is possible to effectively and uniformly dissipate heat from a die. In addition, it is possible to increase the heat dissipation capacity of the IHS 10 for specific locations associated with hotspots in a die 50.

While we have shown and described only a few examples herein, it is understood that numerous changes and modifications as known to those skilled in the art could be made to the example embodiment of the present invention. Therefore, we do not wish to be limited to the details shown and described herein, but intend to cover all such changes and modifications as are encompassed by the scope of the appended claims.

We claim:

1. A method of manufacturing an integrated heat spreader, comprising:
    exposing a plurality of integrated heat spreaders to heat;
    performing a dimensional analysis on each of the plurality of integrated heat spreaders to determine any deformation of a shape of the integrated heat spreader;
    altering the shape of the plurality of integrated heat spreaders to minimize for the deformation in the shape of the plurality of integrated heat spreaders as determined by the dimensional analysis.

2. The method recited in claim 1, wherein exposing a plurality of integrated heat spreaders to heat further comprises:
    building the plurality of integrated heat spreaders so that they have at least one flat surface area upon which a heat sink may be placed.

3. The method recited in claim 2, wherein building the plurality of integrated heat spreaders so that they have at least one flat surface area upon which a heat sink may be placed further comprises:
    building a plurality of series of the plurality of integrated heat spreaders wherein a series of the plurality of series comprises at least one integrated heat spreader having a shape to compensate for deformations seen by the dimensional analysis which is different from a shape of an integrated heat spreader from another series of the plurality of series.

4. The method recited in claim 3, wherein altering the shape of the plurality of integrated heat spreaders further comprises:
selecting the series of the plurality of series of the plurality of integrated heat spreaders having the at least one flat surface area remaining flat when exposed to heat generated by a die.

5. The method recited in claim 4, further comprising:
determining if any hotspots are generated by the die; and
modifying a local shape of the plurality of integrated heat spreaders to reduce a gap between the integrated heat spreader and the heat sink.

6. A computer program embodied on a computer readable medium and executable by a computer for manufacturing an integrated heat spreader, comprising:
exposing a plurality of integrated heat spreaders to an elevated temperature;
performing a dimensional analysis on each of the plurality of integrated heat spreaders to determine a shape of the integrated heat spreader;
altering the shape of the plurality of integrated heat spreaders to compensate for any deformation in the shape of the plurality of integrated heat spreaders seen by the dimensional analysis.

7. The computer program recited in claim 6, wherein exposing a plurality of integrated heat spreaders to an elevated temperature further comprises:
building the plurality of integrated heat spreaders so that they have at least one flat surface area upon which a heat sink may be placed.

8. The computer program recited in claim 7, wherein building the plurality of integrated heat spreaders so that they have at least one flat surface area upon which a heat sink may be placed further comprises:
building a plurality of series of the plurality of integrated heat spreaders wherein a series of the plurality of series comprises at least one integrated heat spreader having a shape to compensate for deformations seen by the dimensional analysis which is different from a shape of an integrated heat spreader from another series of the plurality of senes.

9. The computer program recited in claim 8, wherein altering the shape of the plurality of integrated heat spreaders to compensate for any deformation in the shape of the plurality of integrated heat spreaders seen by the dimensional analysis further comprises:
selecting the series of the plurality of series of the plurality of integrated heat spreaders having the at least one flat surface area remaining flat when exposed to heat generated by a die.

10. The computer program recited in claim 9, further comprising:
determining if any hotspots are generated by the die; and
modifying the local geometry of the integrated heat spreaders to reduce a gap between the integrated heat spreader and the heat sink.

11. A method comprising:
exposing a plurality of integrated heat spreaders to heat;
performing a dimensional analysis on each of the plurality of integrated heat spreaders to determine a deformation of a shape of the integrated heat spreader; and
altering the shape of the plurality of integrated heat spreaders to reduce the deformation of the shape of the plurality of integrated heat spreaders as determined by the dimensional analysis.

12. The method recited in claim 11, wherein exposing a plurality of integrated heat spreaders to heat further comprises:
building the plurality of integrated heat spreaders so that they have at least one flat surface area upon which a heat sink may be placed.

13. The method recited in claim 12, wherein building the plurality of integrated heat spreaders further comprises:
building the plurality of integrated heat spreaders each having a different initial shape.

14. The method recited in claim 13, further comprising:
selecting an integrated heat spreader from the plurality of integrated heat spreaders, the selected integrated heat spreader having the flattest surface when exposed to heat generated by a die; and
building additional integrated heat spreaders having the initial shape of the selected integrated heat spreader.

15. The method recited in claim 14, further comprising:
determining if a hotspot is generated on the die.

16. The method recited in claim 15, further comprising modifying a curvature of the additional integrated heat spreaders in an area of the hotspot to facilitate a transmission of heat.

17. The method recited in claim 15, further comprising adding material to a surface of each of the additional integrated heat spreaders at a point closely associated with the hotspot to facilitate a transmission of heat.

18. The method recited in claim 11, further comprising building the plurality of integrated heat spreaders, each integrated heat spreader having a flat surface, before exposing the plurality of integrated heat spreaders to heat.

19. The method recited in claim 11 wherein performing a dimensional analysis further includes performing a Moiré Fringe analysis for measuring a deformation in each integrated heat spreader.

20. The method recited in claim 11 wherein performing a dimensional analysis further includes performing a statistical analysis on results of the dimensional analysis for each integrated heat spreader to determine an average deformation for each integrated heat spreader.

21. The method recited in claim 11, further comprising generating a series of sets of integrated heat spreaders that have a varying curvature to compensate for a warpage seen by the dimensional analysis.

22. The method recited in claim 21 wherein each set of integrated heat spreaders includes a statistically significant number of integrated heat spreaders having a consistent shape within the set, the integrated heat spreaders in the sets varying in degree of compensation from one set to another.

23. The method recited in claim 11, further comprising generating a plurality of integrated heat spreaders, the integrated heat spreaders varying in curvature from one another to form a distribution of integrated heat spreaders of varying curvatures.

24. The method recited in claim 23, further comprising:
assembling the integrated heat spreaders from the distribution into packages, each package including one of the integrated heat spreaders between a heat sink and a die attached to a substrate; and
selecting the curvature of the integrated heat spreader of the package that is flattest when powered on to be a template shape for an integrated heat spreader design.

25. A computer program embodied on a computer readable medium and executable by a computer for manufacturing an integrated heat spreader, comprising:
exposing a plurality of integrated heat spreaders to heat;

performing a dimensional analysis on each of the plurality of integrated heat spreaders to determine a deformation of a shape of the integrated heat spreader; and altering the shape of the plurality of integrated heat spreaders to reduce the deformation of the shape of the plurality of integrated heat spreaders as determined by the dimensional analysis.

26. The computer program recited in claim 25, wherein exposing a plurality of integrated heat spreaders to heat further comprises:

exposing the plurality of integrated heat spreaders to heat, each integrated heat spreader having at least one flat surface area upon which a heat sink may be placed.

27. The computer program recited in claim 26, further comprising:

selecting an integrated heat spreader from the plurality of integrated heat spreaders, the selected integrated heat spreader having the flattest surface when exposed to heat generated by a die.

28. The computer program recited in claim 27, further comprising:

determining if a hotspot is generated on the die; and modifying a curvature of the selected integrated heat spreader in an area of the hotspot to facilitate a transmission of heat.

29. The computer program recited in claim 25, wherein performing a dimensional analysis further includes performing a Moiré Fringe analysis for measuring a deformation in each integrated heat spreader.

30. The computer program recited in claim 25, wherein performing a dimensional analysis further includes performing a statistical analysis on results of the dimensional analysis for each integrated heat spreader to determine an average deformation for each integrated heat spreader.

* * * * *

UNITED STATES PATENT AND TRADEMARK OFFICE
CERTIFICATE OF CORRECTION

| | | |
|---|---|---|
| PATENT NO. | : 7,256,058 B2 | Page 1 of 1 |
| APPLICATION NO. | : 11/470209 | |
| DATED | : August 14, 2007 | |
| INVENTOR(S) | : Fitzgerald et al. | |

It is certified that error appears in the above-identified patent and that said Letters Patent is hereby corrected as shown below:

In column 9, line 44, in Claim 8, delete "senes." and insert -- series. --, therefor.

Signed and Sealed this

Twentieth Day of November, 2007

JON W. DUDAS
*Director of the United States Patent and Trademark Office*